(12) United States Patent
Kanda

(10) Patent No.: US 8,208,320 B2
(45) Date of Patent: Jun. 26, 2012

(54) SEMICONDUCTOR DEVICE HAVING RESET COMMAND

(75) Inventor: Kazushige Kanda, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 284 days.

(21) Appl. No.: 12/727,860

(22) Filed: Mar. 19, 2010

(65) Prior Publication Data

US 2010/0246280 A1      Sep. 30, 2010

(30) Foreign Application Priority Data

Mar. 30, 2009   (JP) ................................. 2009-082991

(51) Int. Cl.
 G11C 7/00      (2006.01)
 G11C 7/10      (2006.01)
 G11C 8/00      (2006.01)
(52) U.S. Cl. ................. 365/191; 365/189.05; 365/233.1
(58) Field of Classification Search ................... 365/191
 See application file for complete search history.

(56) References Cited

U.S. PATENT DOCUMENTS

| | | | | |
|---|---|---|---|---|
| 5,365,481 | A | * | 11/1994 | Sawada .......................... 365/201 |
| 6,118,709 | A | * | 9/2000 | Zink et al. ..................... 365/191 |
| 6,690,220 | B2 | * | 2/2004 | Kuboshima et al. .......... 327/198 |
| 7,193,907 | B2 | * | 3/2007 | Nakatake et al. ........ 365/189.09 |
| 7,619,937 | B2 | * | 11/2009 | Yun et al. ...................... 365/201 |
| 2005/0189970 | A1 | * | 9/2005 | Nakatake et al. ............. 327/143 |

FOREIGN PATENT DOCUMENTS

| | | |
|---|---|---|
| JP | 4-205118 | 7/1992 |
| JP | 2000-10666 | 1/2000 |
| JP | 2004-279052 | 10/2004 |
| JP | 2006-139321 | 6/2006 |
| JP | 2007-33035 | 2/2007 |
| JP | 2009-54031 | 3/2009 |

OTHER PUBLICATIONS

Office Action issued May 24, 2011, in Japanese Patent Application No. 2009-082991 (with English-language translation).

* cited by examiner

*Primary Examiner* — Son Mai

(74) *Attorney, Agent, or Firm* — Oblon, Spivak, McClelland, Maier & Neustadt, L.L.P.

(57) ABSTRACT

A semiconductor device includes a reset sequence circuit, a latch circuit, and a reset control circuit. The reset sequence circuit is activated by receiving an externally input signal when a reset operation is started and outputs a first trigger signal. The latch circuit is capable of holding selection information on circuits capable of being reset. The selection information is externally input. The reset control circuit outputs a reset signal on the basis of the selection information held in the latch circuit in response to a power-on reset signal and the first trigger signal output from the reset sequence circuit.

18 Claims, 16 Drawing Sheets

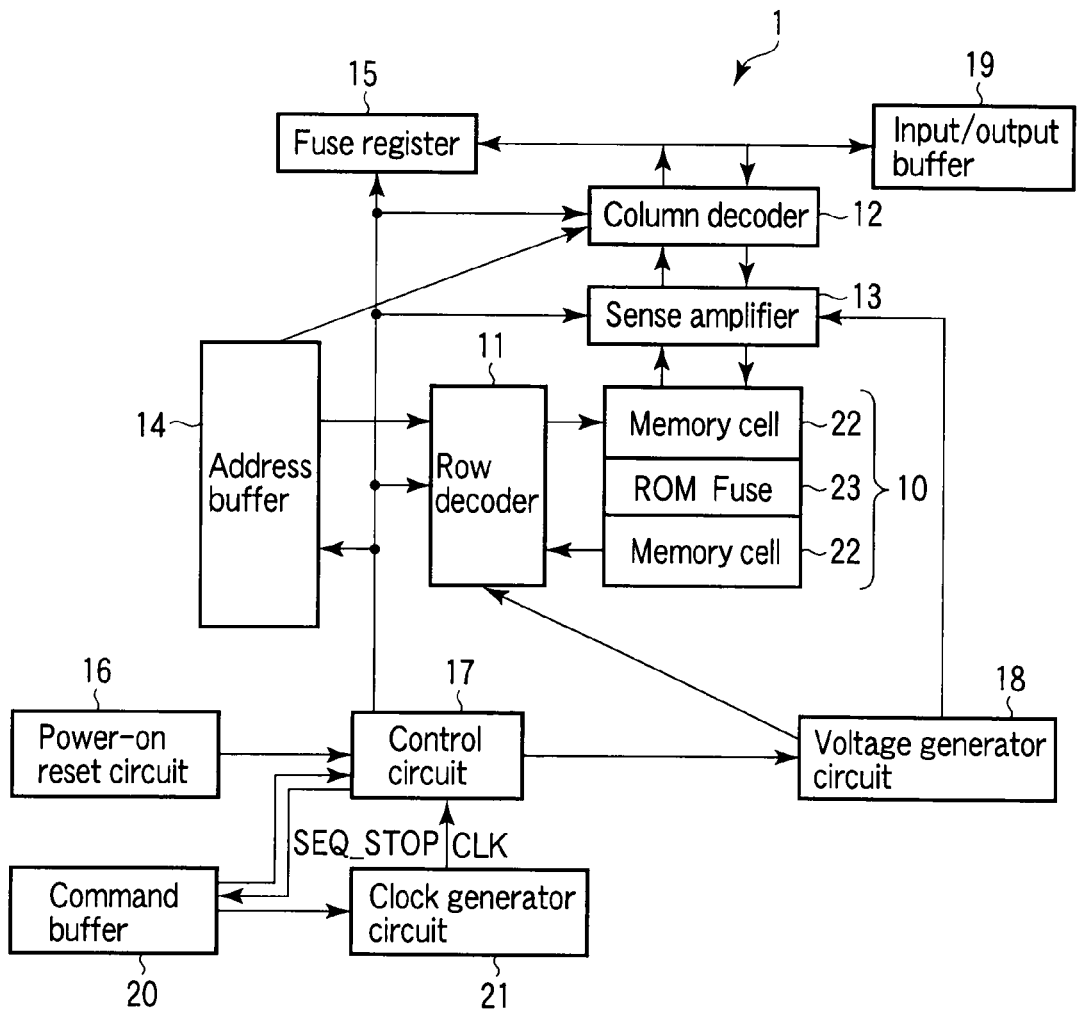
F I G. 1

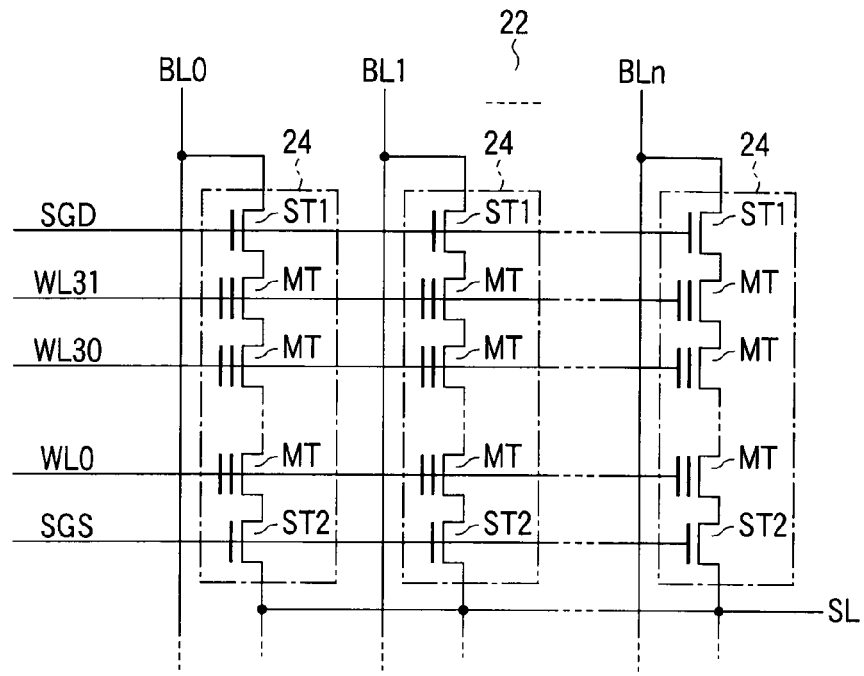
F I G. 2
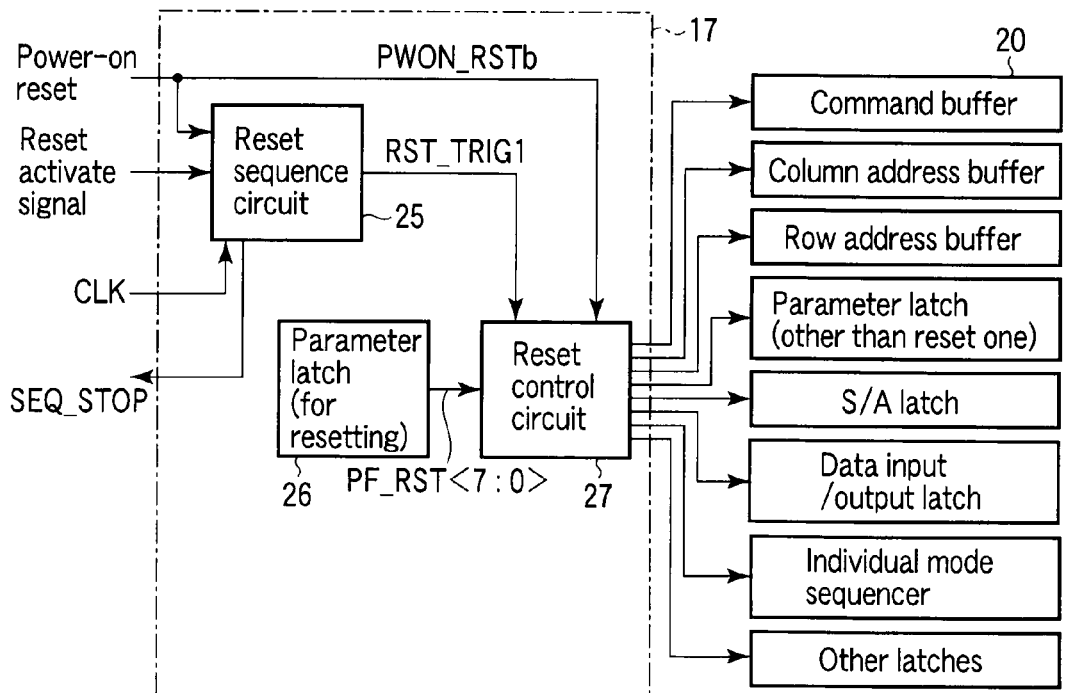
F I G. 3

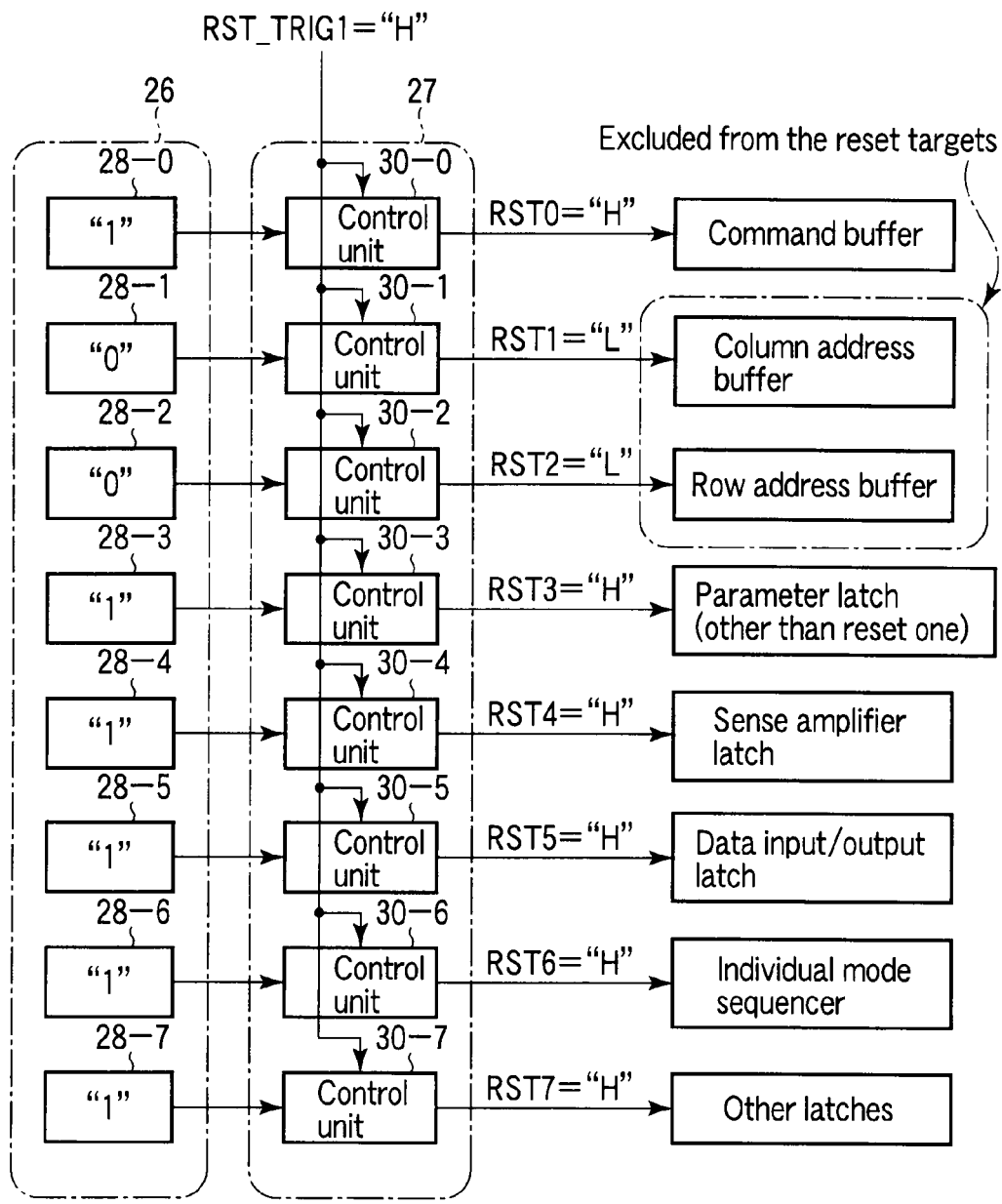
F I G. 6

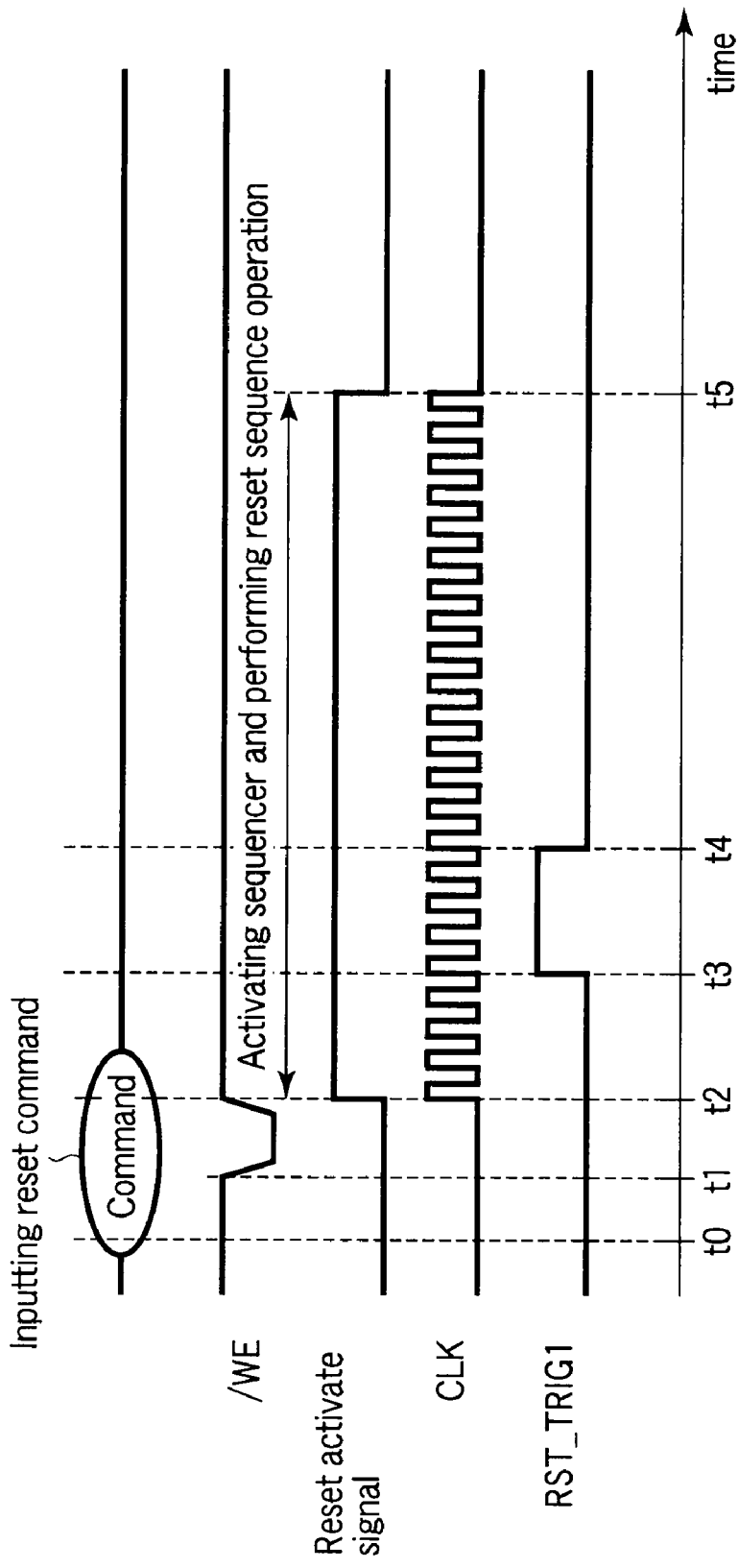
F I G. 10

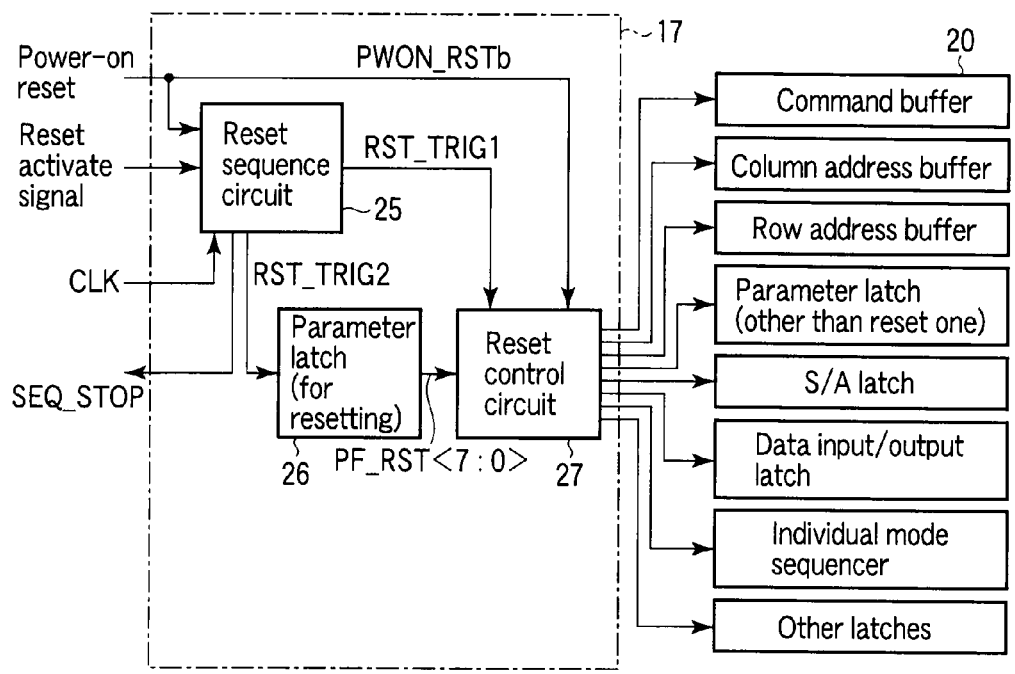
F I G. 1 1

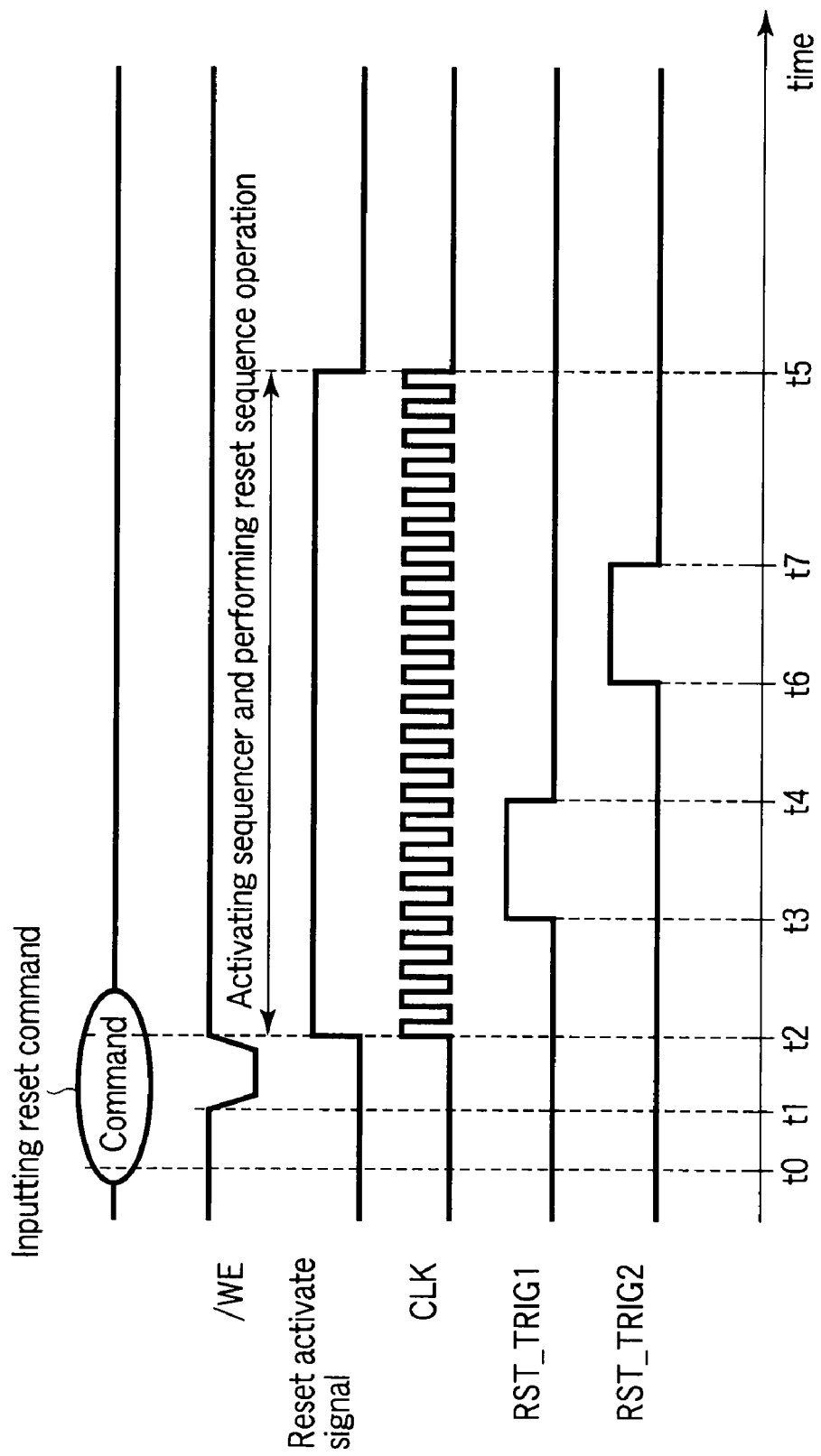
F I G. 12

SEMICONDUCTOR DEVICE HAVING RESET COMMAND

CROSS-REFERENCE TO RELATED APPLICATIONS

This application is based upon and claims the benefit of priority from prior Japanese Patent Application No. 2009-082991, filed Mar. 30, 2009, the entire contents of which are incorporated herein by reference.

BACKGROUND OF THE INVENTION

1. Field of the Invention

This invention relates to a semiconductor device. More particularly, this invention relates to a semiconductor device having, for example, a reset command.

2. Description of the Related Art

A NAND flash memory has been provided with a reset command capable of being externally input. The user inputs the command, thereby resetting various circuits in the NAND flash memory. Such techniques have been disclosed in, for example, Jpn. Pat. Appln. KOKAI Publication No. 2007-033035.

However, when the reset command is used, all pieces of information, including those the user wants to leave in the NAND flash memory, are erased. Accordingly, for example, when various operation tests are conducted under a specific condition, data has to be input to set the NAND flash memory in the specific condition each time the reset command is input, which makes the tests cumbersome and complicated.

BRIEF SUMMARY OF THE INVENTION

A semiconductor device according to an aspect of the present invention includes:

a reset sequence circuit which is activated by receiving an externally input signal when a reset operation is started and outputs a first trigger signal;

a latch circuit which is capable of holding selection information on circuits capable of being reset, the selection information being externally input; and a reset control circuit which outputs a reset signal on the basis of the selection information held in the latch circuit in response to a power-on reset signal and the first trigger signal output from the reset sequence circuit.

BRIEF DESCRIPTION OF THE SEVERAL VIEWS OF THE DRAWING

FIG. 1 is a block diagram of a semiconductor device according to a first embodiment of the invention;

FIG. 2 is a circuit diagram of a memory cell array according to the first embodiment;

FIG. 3 is a block diagram of a control circuit according to the first embodiment;

FIGS. 5 and 6 are block diagrams of a reset control circuit according to the first embodiment;

FIG. 10 is a timing chart for various signals according to the first embodiment;

FIG. 11 is a block diagram of a control circuit according to a second embodiment of the invention;

FIG. 12 is a timing chart for various signals according to the second embodiment;

DETAILED DESCRIPTION OF THE INVENTION

First Embodiment

Figure 4:
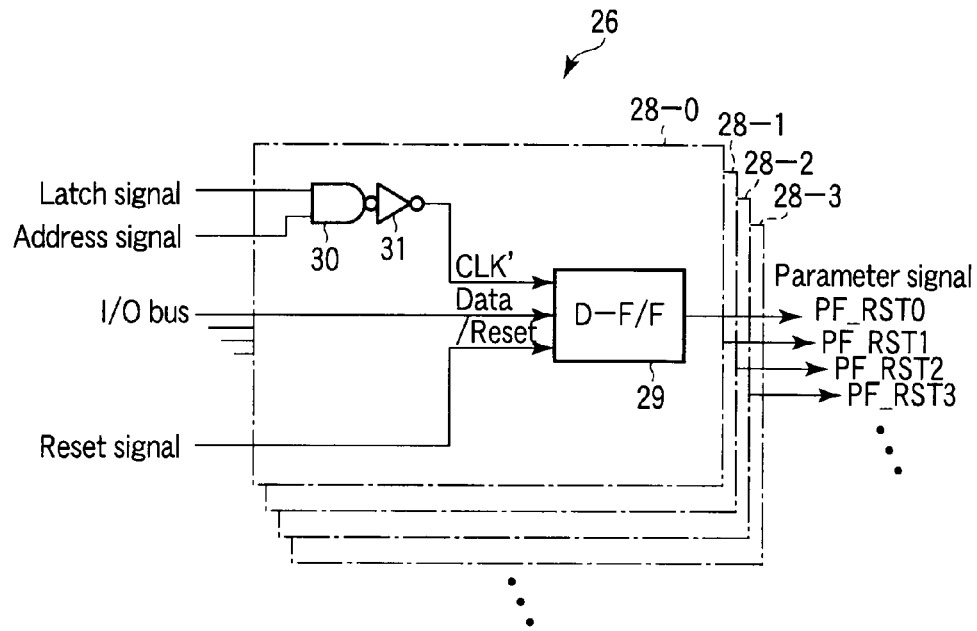
FIG. 4 is a circuit diagram of a parameter latch according to the first embodiment.

A semiconductor device according to a first embodiment of the invention will be explained, taking a NAND flash memory as an example.

Overall Configuration

The overall configuration of a NAND flash memory according to the first embodiment will be explained with reference to FIG. 1. FIG. 1 is a block diagram of a NAND flash memory according to the first embodiment.

As shown in FIG. 1, the NAND flash memory 1 includes a memory cell array 10, a row decoder 11, a column decoder 12, a sense amplifier 13, an address buffer 14, a fuse register 15, a power-on reset circuit 16, a control circuit 17, a voltage generator circuit 18, an input/output buffer 19, a command buffer 20, and a clock generator circuit 21.

The memory cell array 10, which includes a memory cell area 22 and a ROM fuse area 23, is formed by a plurality of memory cell transistors capable of holding data. Each of the memory cell transistors is electrically connected to a bit line BL and a word line WL. In the ROM fuse area 23, fuse data, including chip-specific redundancy information and voltage trimming information, are written. That is, the ROM fuse area 23, which has the same configuration as that of the memory cell area 22, is a part of the memory cell array used as an area for storing fuse data. Accordingly, the ROM fuse area 23, which cannot be accessed by the user, is read automatically at the time of power-on.

The input/output buffer 19 supervises the exchange of signals with the external, such as a host unit. The input/output buffer 19 transfers command data, address data, and input data from the outside to a data bus (not shown), thereby supplying the data items to the command buffer 20, address buffer 14, and sense amplifier 13, respectively.

The address buffer 14 temporarily holds an address supplied from the input/output buffer 19. Of the addresses held, the address buffer 14 supplies a row address to the row decoder 11 and a column address to the column decoder 12.

The command buffer 20 temporarily holds a command supplied from the input/output buffer 19. Then, the command buffer 20 supplies a signal corresponding to the command to the control circuit 17 and clock generator circuit 21. More specifically, for example, when having received a reset command, the command buffer 20 generates a reset activate signal to activate a reset function of the control circuit 17 and supplies the signal to the control circuit 17. The command buffer 20 also instructs the clock generator circuit 21 to generate a clock. Furthermore, when the reset sequence has been completed, the command buffer 20 receives an end signal SEQ_STOP sent from a sequencer of the control circuit 17 and deactivates the reset activate signal.

The clock generator circuit 21 generates a clock CLK in response to the signal supplied from the command buffer 20. The NAND flash memory is operated in synchronization with the clock CLK. After the command buffer 20 has deactivated the reset activate signal, the clock generator circuit 21 stops the generation of the clock CLK.

The row decoder 11 selects a row direction in the memory cell area 22 according to the row address supplied from the address buffer 14. That is, when data is read, written, or erased, the row decoder 11 selects a word line WL and applies a voltage to the word line WL.

The sense amplifier 13 includes a plurality of sense amplifier circuits (not shown). The sense amplifier circuits are associated to the bit lines BL in one-to-one correspondence. Each of the sense amplifier circuits senses and amplifies data read onto an associated bit line BL in a read operation. In a write operation, each of the sense amplifier circuits 13 transfers the write data to an associated bit line BL.

The column decoder 12 selects a column direction in the memory cell area 22 according to the column address supplied from the address buffer 14. In other word, the column decoder 12 selects the sense amplifier circuits.

The fuse register 15, which is electrically connected to the input/output buffer 19, holds necessary data, such as management data.

The power-on reset circuit 16 informs the control circuit 17 of the power-on of the NAND flash memory 1. That is, the power-on reset circuit 16 monitors the power supply voltage. When the power supply voltage has reached a specific value required for the NAND flash memory 1 to operate after, for example, the power supply of the NAND flash memory 1 has been turned on, the power-on reset circuit 16 detects this and outputs a power-on reset signal PWON_RSTb to the control circuit 17.

The voltage generator circuit 18 generates various voltages necessary for the operation of the NAND flash memory 1 under the control of the control circuit 19. Then, the voltage generator circuit 18 supplies the generated voltages to, for example, the row decoder 11 and sense amplifier 13.

The control circuit 17 controls the above circuits according to the signal supplied from the command buffer 20, thereby, for example, writing, reading, or erasing data. When receiving the power-on reset signal PWON_RSTb, the control circuit 17 resets the NAND flash memory 1.

Configuration of Memory Cell Array 10

Next, the configuration of the memory cell array 10 will be explained with reference to FIG. 2.

As shown in FIG. 2, the memory cell array 10 includes a plurality of memory cell units 24. Each of the memory cell units 24 includes, for example, 32 memory cell transistors MT0 to MT31 and select transistors ST1, ST2. Hereinafter, when there is no need to distinguish between memory cell transistors MT0 to MT31, they will simply be referred to as memory cell transistors MT. Each of memory cell transistors MT has a stacked gate structure including a charge accumulation layer (e.g., a floating gate or a silicon nitride film), formed on a semiconductor substrate with a gate insulating film interposed therebetween, and a control gate formed on the charge accumulation layer with an inter-gate insulating film interposed therebetween. The number of memory cell transistors MT is not limited to 32 and may be 8, 16, 64, 128, or 256, and is nonlimiting. Adjacent memory cell transistors share a source or a drain. The memory cell transistors MT are arranged between select transistors ST1, ST2 in such a manner that their current paths are connected in series. The drain on one end side of the memory cell transistors MT connected in series is connected to the source of select transistor ST1 and the source on the other end side is connected to the drain of select transistor ST2.

The control gates of memory cell transistors MT in the same row are connected to any one of word lines WL0 to WL31 in a common connection manner. The gates of select transistors ST1 of the memory cells in the same row are connected to a select gate line SGD in a common connection manner. The gates of select transistors ST2 of the memory cells in the same row are connected to a select gate line SGS in a common connection manner. To simplify the explanation, word lines WL0 to WL31 will sometimes simply be referred to as word lines WL. The drain of select transistor ST1 is connected to any one of bit lines BL0 to BLn (n is a natural number). Bit lines BL0 to BLn will sometimes simply be referred to as bit lines BL. The sources of select transistors ST2 are connected to a source line SL in a common connection manner. Both of the select transistors ST1, ST2 are not necessarily needed. Only one of the select transistors ST1, ST2 may be used, provided that the memory cell unit 24 can be selected.

FIG. 2 shows only one-row memory cell units 24. In the memory cell area 22, however, multi-row memory cell units 24 (more specifically, a plurality of the memory cell units are arranged lengthways in FIG. 2) may be provided. The memory cell units 24 in the same column are connected to the same bit line BL. Data is written simultaneously into a plurality of memory cell transistors MT connected to the same word line WL. This unit is called a page. The data in a plurality of memory cell units 24 in the same row is erased simultaneously. This unit is called a memory block.

Configuration of Control Unit 17

Next, the configuration of the control unit 17 will be explained in detail with reference to FIG. 3. FIG. 3 is a block diagram of the control circuit 17, particularly showing a part necessary for a reset operation. As shown in FIG. 3, the control circuit 17 includes a reset sequence circuit 25, a parameter latch 26, and a reset control circuit 27.

Reset Sequence Circuit 25

The reset sequence circuit 25 is a sequencer that executes a sequence necessary for a reset operation. When having received a power-on reset signal PWON_RSTb supplied from the power-on reset circuit 16 or a reset activate signal supplied from the command buffer 20, the reset sequence circuit 25 is activated and starts to operate. Then, the reset sequence circuit 25 executes the sequence in synchronism with the clock CLK and generates a trigger signal RST_TRIG1 on which a reset signal is based. Moreover, having finished the reset sequence, the reset sequence circuit 25 outputs an end signal SEQ_STOP to the command buffer 20.

Parameter Latch 26

The parameter latch 26 holds information as to whether a circuit capable of being reset is a reset target. FIG. 4 is a block diagram of the parameter latch 26. Here, the command buffer 20, a column address buffer, a row address buffer, a parameter latch other than a reset one, a sense amplifier latch, a data input/output latch, an individual mode sequencer, and another latch shown in FIG. 3 are pointed out as eight examples of the circuit capable of being reset.

The command buffer 20 is as explained in FIG. 1. The column address buffer, which is included in, for example, the address buffer 14, holds a column address. The row address buffer, which is also included in, for example, the address buffer 14, holds a row address. The parameter latch holds a parameter for setting various options the NAND flash memory 1 has. The sense amplifier latch, which is included in the sense amplifier 13, holds write data or read data. The data input/output latch is a buffer provided in a data input/output path. The individual mode sequencer, which is for executing, for example, a read sequence or a write sequence, may include a reset sequence circuit 25.

The parameter latch 26 includes parameter hold units 28-0 to 28-7 provided for the above eight circuits, respectively. Hereinafter, when there is no need to distinguish between parameter hold units 28-0 to 28-7, they will simply be referred to as parameter hold units 28.

Each of the parameter hold units 28 includes a D flip-flop 29, a NAND gate 30, and an inverter 31. The D flip-flop 29 holds information as to whether a circuit corresponding to the parameter hold unit 28 is a reset target. For example, if the circuit is a reset target, the D flip-flop 29 holds "1" and, if it is not a reset target, the D flip-flop 29 holds "0." The information is input as data to the D flip-flop 29 from an I/O bus via the input/output buffer 19. Then, the D flip-flop 29 outputs the held data as parameter signals PF_RST0 to PF_RST7. Hereinafter, when there is no need to distinguish between parameter signals PF_RST0 to PF_RST7, they will simply be referred to as parameter signals PF_RST.

The NAND gate 30 performs NAND operation of a latch signal and an address signal. The latch signal and address signal are externally supplied signals. The latch signal is made high to cause the parameter hold unit 28 to hold information. The address signal is for selecting parameter hold units 28-0 to 28-7. The inverter 31 inverts the output of the NAND gate 30 and supplies the inverted output as clock CLK' to the D flip-flop 29.

The data and address signal is, for example, 8-bits signal. This 8-bits address signal selects the eight parameter hold units in block and each bit of the 8-bits data is input to eight D flip-flops 29, respectively. When other parameter hold units (parameter hold units 28-8, . . . , not shown in figure) are selected, the data and address signal corresponding to these units 28-8, . . . are input. In this case, the parameter hold units 28-0 to 28-7 are not selected.

For example, in a case where a reset command has been input to the NAND flash memory 1, to leave out the command buffer 20 from the reset targets, the D flip-flop 29 of parameter hold unit 28-0 corresponding to the command buffer 20 is caused to hold "0." To do this, an address corresponding to parameter hold unit 28-0 to 28-7 is input as an address signal. As a result, clock CLK' goes high, causing D flip-flop 29 of parameter hold unit 28-0 to take in "0" data input as data from the I/O bus. Then, it follows that parameter signal PF_RST0="L."

The reset signal /Reset is supplied from, for example, the command buffer 20. Inputting the reset signal /Reset resets the data in D flip-flop 29, with the result that D flip-flop 29 holds default value. That is, the default value of the parameter hold unit 28 is "1" or "0" depending on the D-flip-flops 29. When no data is set in D flip-flop 29, predetermined circuits are reset targets.

Reset Control Circuit 27

To return to FIG. 3, the reset control circuit 27 generates reset signals RST0 to RST7 for the respective circuits to be reset, on the basis of power-on reset signal PWON_RSTb, parameter signal PF_RST supplied from the parameter latch 26, and trigger signal RST_TRIG1 supplied from the reset sequence circuit 25. When reset signals RST0 to RST7 are supplied (or asserted), the command buffer 20, column address buffer, row address buffer, parameter latch other than a reset one, sense amplifier latch, data input/output latch, individual mode sequencer, and other latch are reset.

Figure 5:
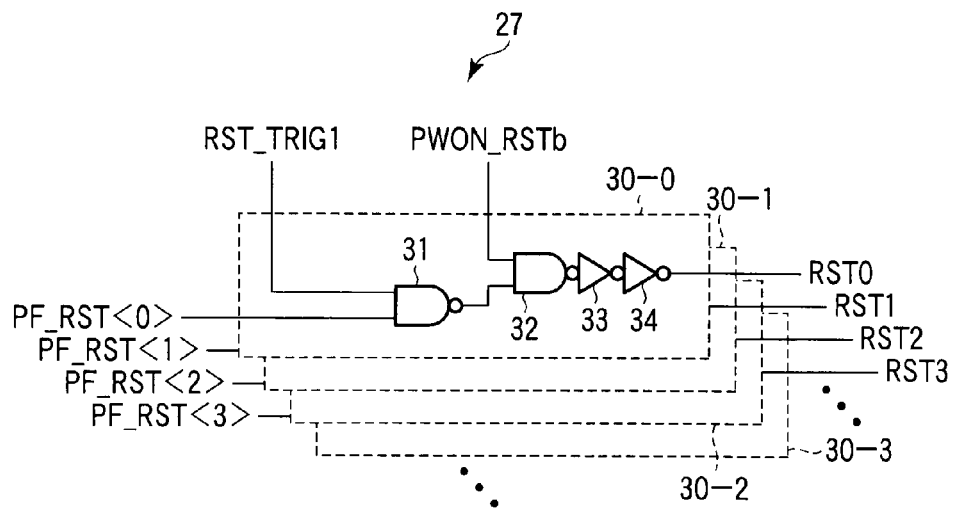

FIG. 5 is a block diagram of the reset control circuit 27. As shown in FIG. 5, the reset control circuit 27 includes control units 30-0 to 30-7 provided for the eight circuits capable of being reset, respectively. Parameter signals PF_RST0 to PF_RST7 are input to control units 30-0 to 30-7, respectively. In addition, trigger signal RST_TRIG1 and power-on reset signal PWON_RSTb are input to each of control units 30-0 to 30-7. According to these signals, control units 30-0 to 30-7 generate and output reset signals RST0 to RST7, respectively. Hereinafter, when there is no need to distinguish between control units 30-0 to 30-7, they will simply be referred to as control units 30. In addition, reset signals RST0 to RST7 will sometimes simply be called reset signals RST.

Each of the control units 30 includes NAND gates 31, 32 and inverters 33, 34. NAND gate 31 performs NAND operation of the corresponding parameter signal RF_RST and trigger signal RST_TRIG1. NAND gate 32 performs NAND operation of the operation result of NAND gate 31 and power-on reset signal PWON_RSTb. Inverter 33 inverts the operation result of NAND gate 32. Inverter 34 inverts the operation result of inverter 33 and outputs the result as a reset signal RST.

With this configuration, power-on reset signal PWON_RSTb is a low-active signal. Accordingly, if power-on reset signal PWON_RSTb is asserted (or made low) or the output of NAND gate 31 goes low, the reset signal RST is asserted (or made high). It is when parameter signal PF_RST and trigger signal RST_TRIG1 are high that the output of the NAND gate 31 goes low. That is, when parameter signal PF_RST goes low, this makes trigger signal RST_TRIG1 invalid.

Reset Signal RST

Next, the generation of a reset signal RST by the control circuit 27 configured as described above will be explained briefly.

First, a case where power-on reset signal PWON_RSTb is asserted, for example, after the power supply is turned on, will be explained. In this case, the operation results of NAND gates 32 of all the control units 30 are high, regardless of the operation result of NAND gate 31. Accordingly, the control circuit 27 asserts all of reset signals RST0 to RST7 (or makes all of reset signals RST0 to RST7 high). As a result, all of the circuits capable of being reset, including the command buffer 20, column address buffer, row address buffer, parameter latch other than a reset one, sense amplifier latch, data input/output latch, individual mode sequencer, and other latch, are reset.

Next, a case where a reset command is externally input will be explained with reference to FIG. 6. FIG. 6 is a schematic block diagram of the control circuit 27. As shown in FIG. 6, for example, suppose parameter hold units 28-1, 28-2 hold "0" and the other parameter hold units 28-0 and 28-3 to 28-7 hold "1." Then, when trigger signal RST_TRIG1 is made high, control units 30-0 and 30-3 to 30-7 output high reset signals RST0 and RST3 to RST7, respectively. Control units 30-1, 30-2 keep reset signals RST1, RST2 at the low level. As a result, the column address buffer and row address buffer are prevented from performing a reset operation.

Operation of NAND Flash Memory

Next, the operation of the NAND flash memory 1 configured as described above will be explained, particularly focusing on a reset operation.

When the power supply of the NAND flash memory 1 is turned on, the power-on reset circuit 16 senses that the power supply voltage has reached a specific level. Having been informed of this, the control circuit 17 outputs a reset signal RST, thereby initializing the entire NAND flash memory 1.

Thereafter, the control circuit 17 is activated by an externally input command, thereby a control signal for performing, for example, a write, an erase, or a read operation is generated. In addition, the voltage generator circuit 18 generates a necessary voltage. Then, according to an externally input address, the column decoder 12 and row decoder 11 select a desired bit line BL and a desired word line WL, enabling a memory cell transistor MT to be accessed.

Figure 7:
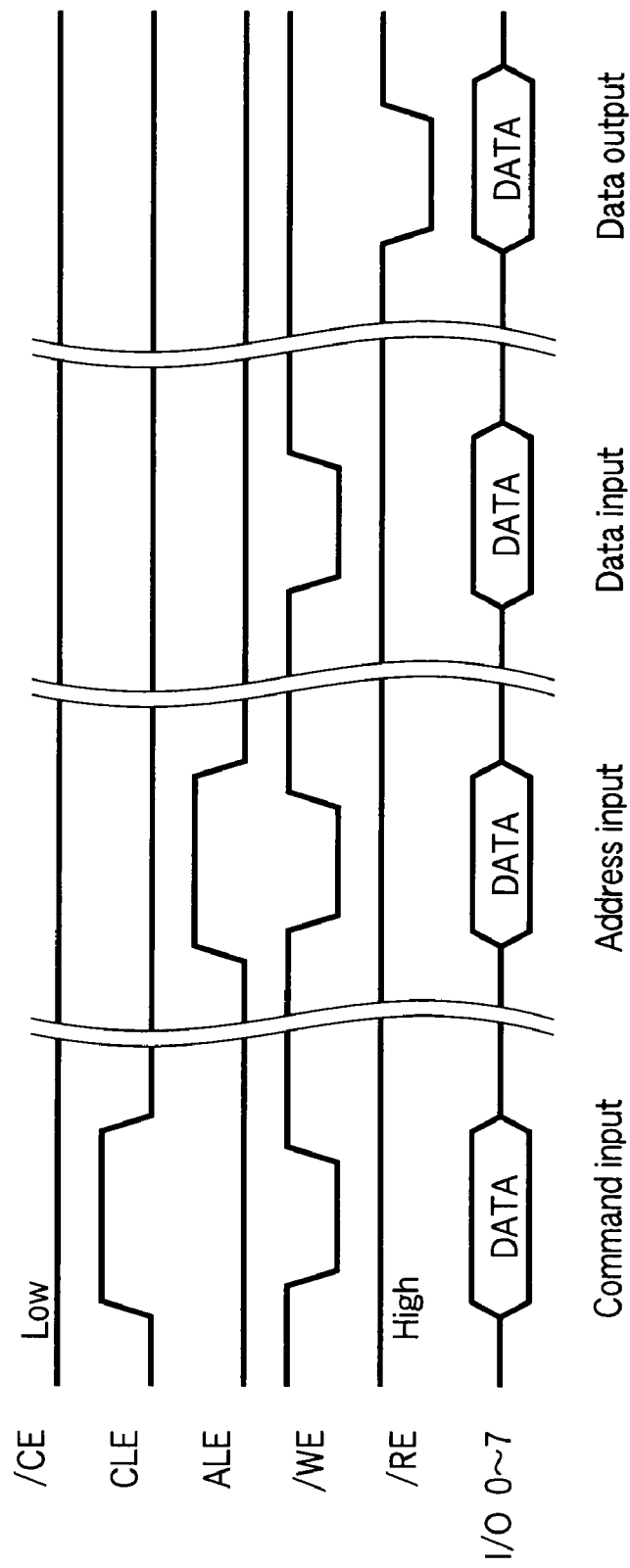
FIGS. 7 and 8 are timing charts to explain various signals and command sequences according to the first embodiment.

In the NAND flash memory 1, the input signals shown in FIG. 7 realize necessary basic operations. FIG. 7 is a timing chart for chip enable signal /CE, command latch enable signal CLE, address latch enable signal ALE, write enable signal /WE, read enable signal /RE, and data supplied to I/O pins 0 to 7 which are supplied from outside the NAND flash memory 1.

Chip enable signal /CE is a signal for enabling the entire NAND flash memory 1. Command latch enable signal CLE is a signal for enabling a command to be taken in by the NAND flash memory 1. Address latch enable signal ALE is a signal for enabling the NAND flash memory 1 to take in an address. Write enable signal /WE is a clock signal for causing the NAND flash memory 1 to take in a signal. Read enable signal /RE is a clock signal for causing the NAND flash memory 1 to output a signal. That is, write enable signal /WE and read enable signal /RE function as an input trigger signal and an output trigger signal for the NAND flash memory 1, respectively. These signals are treated as internal clocks during a period when no sequencer is operating. Here, /CE, /WE, and /RE are low active signals. While the NAND flash memory 1 is operating, /CE is constantly asserted (or at the low level).

When a command is input to the NAND flash memory 1, setting is done as follows: CLE=high ("H") and /WE=low ("L") ("H"→"L"→"H" in a toggle operation). In this state, a signal input to an I/O pin is interpreted as a command. When an address is input to the NAND flash memory 1, setting is done as follows: ALE=high ("H") and /WE=low ("L") ("H"→"L"→"H" in a toggle operation). In this state, a signal input to an I/O pin is interpreted as an address. When data is input to the NAND flash memory 1, setting is done as follows: CLE=ALE=low ("L") and /WE=low ("L") ("H"→"L"→"H" in a toggle operation). In this state, a signal input to an I/O pin is interpreted as data. When data is output from the NAND flash memory 1, setting is done as follows: CLE=ALE=low ("L") and /RE=low ("L") ("H"→"L"→"H" in a toggle operation). In this state, the data is output at the I/O pin.

Command Sequence

Figure 8:
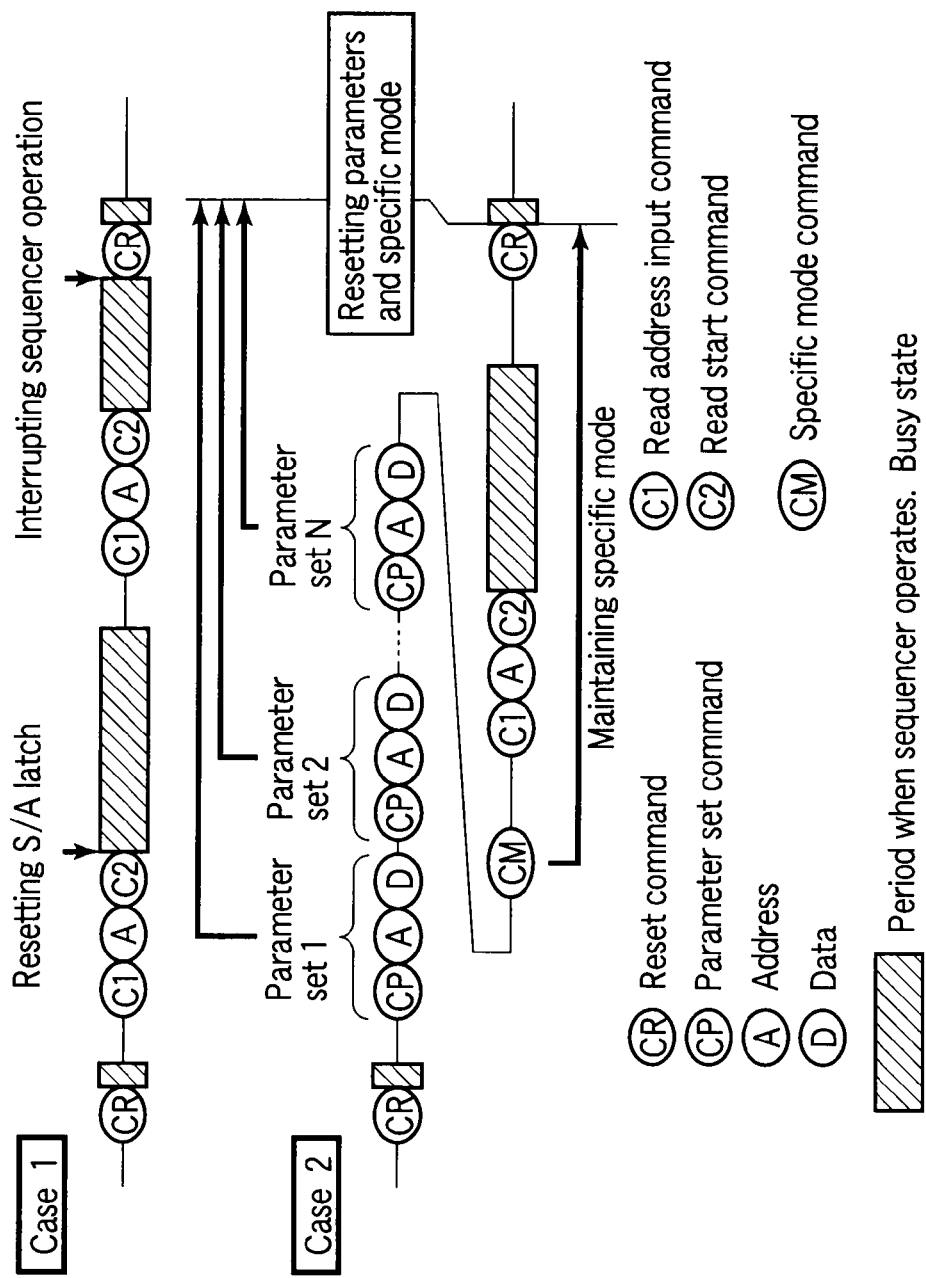

Next, a command sequence in the operation of the NAND flash memory 1 will be explained, taking a data read operation as an example. FIG. 8 is a timing chart to explain a command sequence in a data read operation. In FIG. 8, a read sequence and a case where a reset command is externally supplied in the middle of the read sequence are shown as CASE 1. In addition, a parameter set for setting various options provided for the NAND flash memory 1, a set of operation modes activated by command inputs, and a sequence in resetting these conditions are shown as CASE 2. In FIG. 8, "CR" indicates a reset command; "CP", a parameter set command; "A", an address; "D", data; "C1", an address input command in a read operation; "C2", a read start command; and "CM", a specific mode command. Reset command "CR" is prepared as, for example, command "FFH" in the NAND flash memory 1 ("H" indicates that the preceding numerals are hexadecimal). Each of the shaded portions indicates a period when one of the read and reset sequencers operates. During the period, the NAND flash memory 1 is in the busy state.

(CASE 1)

First, CASE 1 will be explained. As shown in FIG. 8, reset command "CR" is input, activating the reset sequence circuit 25, which resets the NAND flash memory 1.

Thereafter, a first read operation is carried out. To perform a read operation, read address input command "C1" is input. Then, address "A" is input. Thereafter, read start command "C2" is input. In response to read start command "C2", the read sequencer is activated, executing a sequence for reading data. At the initial stage of the sequence, the sense amplifier latch is reset. This is performed automatically by the sequencer without requiring a reset command to be externally input.

In a second read operation, reset command "CR" is externally input while the read sequence is in progress. In this case, the read sequencer interrupts the operation and the reset sequence circuit 25 is activated, performing a reset operation.

Figure 9:
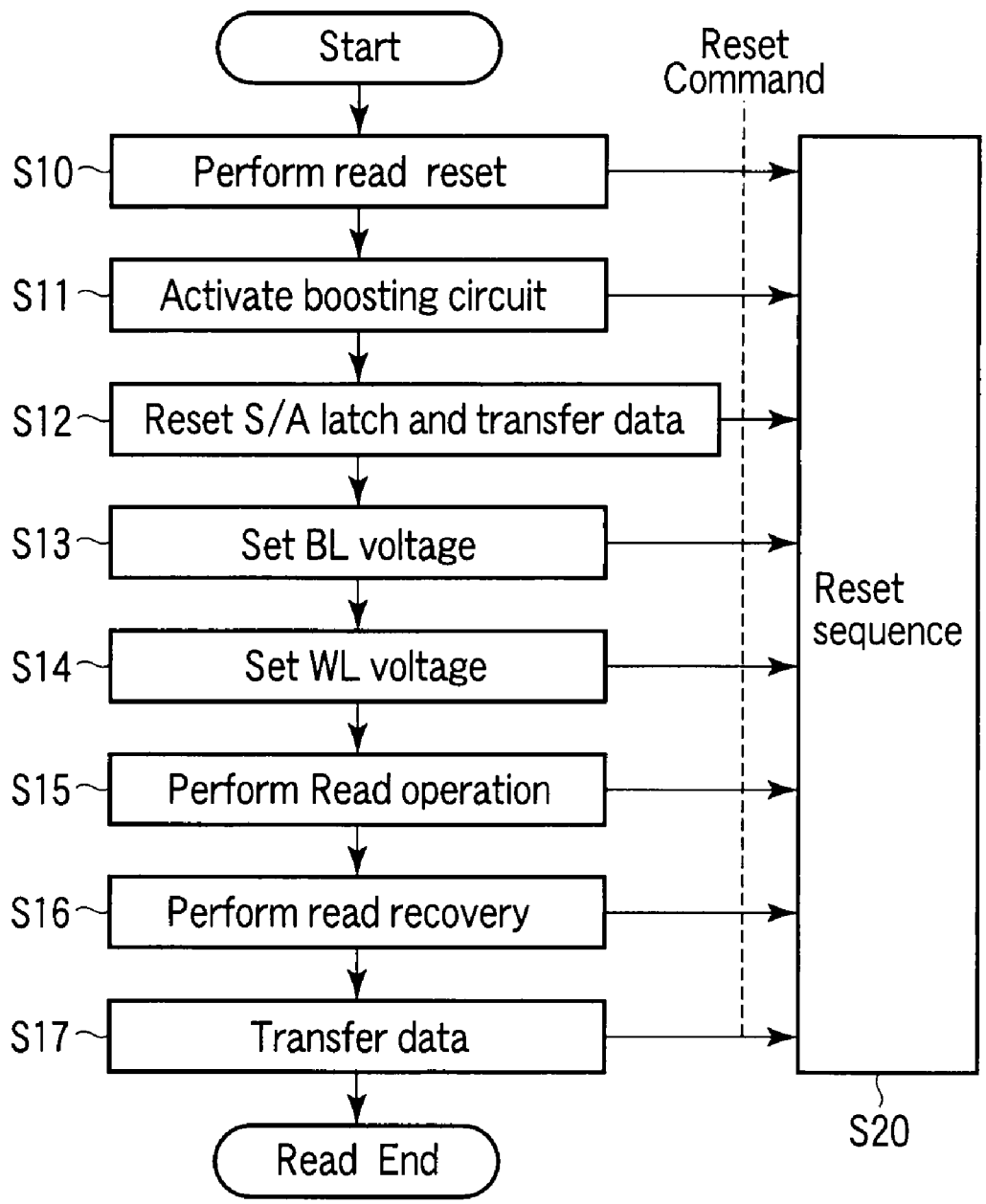
FIG. 9 is a flowchart to explain a read sequence according to the first embodiment.

A concrete example of a read sequence will be explained with reference to FIG. 9. FIG. 9 is a flowchart to explain a read operation. As shown in FIG. 9, the activated read sequencer performs read resetting (step S10). This resets the circuit system necessary for reading, including the row decoder 11 and column decoder 12. Then, the read sequencer activates the boosting circuit of the voltage generator circuit 18 (step S11). The read sequencer then resets the sense amplifier latch, initializing the data held in the sense amplifier latch (step S12).

Thereafter, a voltage on a bit line BL is set (step S13) and the voltage on a word line WL is set (step S14), causing data to be read from the memory cell transistor MT onto the bit line BL (step S15). Then, a recovery operation and a data transfer operation are carried out (steps S16, S17), which completes the sequence. The series of operations corresponds to the first read operation in CASE 1.

If reset command "CR" is externally input while the sequence of FIG. 9 is in progress, the read sequence is interrupted and a reset sequence is executed by the reset sequence circuit 25 (step S20). This corresponds to a second read operation in CASE 1.

(CASE 2)

Next, CASE 2 of FIG. 8 will be explained. In CASE 2, first, reset command "CR" is input, thereby resetting the NAND flash memory 1.

Next, parameter setting is performed a plurality of times (N times). Parameter setting is done by inputting parameter command "CP," address "A," and data "D." Data "D" is a parameter to be input. Setting these parameters causes the NAND flash memory 1 to be set in a desired state. Thereafter, when specific mode command "CM" is input, this brings the NAND flash memory 1 into a specific mode.

In the specific mode, data is read and, finally, reset command "CR" is input. The specific mode is, for example, a mode in which all of the bit lines are made unselected, a mode in which all of the word lines are made unselected, a mode in which optional write schemes using different write methods are tested, or a mode in which writing time and erasing time in a manual write mode or a manual erase mode can be externally controlled.

Since these specific modes are set by inputting external commands, reset command "CR" has to be input to cancel the modes. At this time, to cancel the specific mode, "1" is set in parameter hold unit 28-6. To leave any one of the parameters, "0" is set in parameter hold unit 28-3 corresponding to its parameter latch.

Reset Sequence

Next, a reset sequence will be explained with reference to FIG. 10. FIG. 10 is a timing chart for a command, write enable signal /WE, a reset activate signal, clock CLK, and trigger signal RST_TRIG1.

As shown in FIG. 10, at time t0, reset command "CR" is input. At time t1, write enable signal /WE goes low, causing the NAND flash memory 1 to take in reset command "CR."

Thereafter, at time t2, write enable signal /WE goes high, causing the command buffer to output a reset activate signal (or assert a reset activate signal). As a result, the clock generator circuit 21 starts to generate a clock CLK and the reset sequence circuit 25 of the control circuit 17 is activated, which starts a reset sequence operation.

The reset sequence circuit 25, which has started the reset sequence operation, operates in synchronism with the clock CLK. First, the reset sequence circuit 25 ascertains the present operating state of the NAND flash memory 1. For example, when the NAND flash memory 1 is in the middle of writing or reading data, the reset sequence circuit 25 saves the necessary data, shuts down the boosting circuit, and then performs operations necessary for resetting. Then, in the period between time t3 and time t4, the reset sequence circuit 25 asserts trigger signal RST_TRIG1 (or makes trigger signal RST_TRIG1 high). As a result, according to parameter signal PF_RST supplied from the parameter latch 26, the reset control circuit 27 outputs reset signal RST.

When the reset operation has been completed, the reset sequence circuit 25 outputs an end signal SEQ_STOP to the command buffer 20. At time t5, the reset activate signal is negated (or made low), which completes the reset sequence operation.

Effect

As described above, the semiconductor device of the first embodiment produces the effect described in item (1) below.

(1) A Selective Reset Operation can be Performed.

With the configuration of the first embodiment, when a reset command is input, one of a plurality of control units 30 which has "1" set in the corresponding parameter hold unit 28 outputs a reset signal RST, whereas one which has "0" set in the corresponding parameter hold unit 28 does not output a reset signal RST. That is, the parameter hold unit 28 can select a circuit to be reset.

This makes it possible to control the reset operation in, for example, analyzing a failure, which enables efficient analysis. In addition, the resetting of parameters is unnecessary, which makes it possible to avoid troublesome operations when testing. This will be explained below.

As explained in CASE 2 of FIG. 8, in a test, various parameters are latched in the parameter latches and an operation mode is set by a specific command. To cancel the parameters and mode, reset command "CR" has to be externally input. Reset command "CR" cancels all of the set parameters and operation mode.

However, there may be a case where a certain parameter is required to be left even after the operation mode is cancelled, or a case where the parameter is reset, but the NAND flash memory 1 is required to operate also in the same operation mode next time. In such a case, all of the parameters and operation mode have to be set again.

With the configuration of the first embodiment, however, the user can select a reset target arbitrarily. For example, if the user wants to leave a certain parameter, the user has only to set "0" in the parameter hold unit 28 corresponding to the parameter latch which holds the parameter. Consequently, even when reset command "CR" has been input, the corresponding parameter is not erased. This minimizes the resetting of the parameters and operation mode, enabling test operations to be simplified.

Second Embodiment

Next, a semiconductor device according to a second embodiment of the invention will be explained. The second embodiment is such that all of the data held in the parameter hold unit 28 is initialized after a reset operation in the first embodiment. Hereinafter, only what differs from the first embodiment will be explained.

FIG. 11 is a block diagram of a control circuit 17 according to the second embodiment, particularly showing the control circuit related to a reset operation. As shown in FIG. 11, the reset control circuit 27 of the second embodiment is such that the reset sequence circuit 25 generates trigger signal RST_TRIG2 and supplies the trigger signal as reset signal /Reset to the parameter latch 26 in the configuration of FIG. 3 explained in the first embodiment.

FIG. 12 is a timing chart for a command, write enable signal /WE, a reset activate signal, clock CLK, and trigger signals RST_TRIG1, RST_TRIG2 in a reset sequence operation.

As shown in FIG. 12, the command, write enable signal /WE, reset activate signal, clock CLK, and trigger signal RST_TRIG1 are the same as those of FIG. 10 explained in the first embodiment. In the second embodiment, after trigger signal RST_TRIG1 is asserted in the period between time t3 and time t4, causing a reset signal RST to be generated, trigger signal RST_TRIG2 is asserted (or made high) in the period between time t6 and time t7. Trigger signal RST_TRIG2 functions as reset signal /Reset to the parameter hold unit 28 explained in FIG. 4. Accordingly, when trigger signal RST_TRIG2 is asserted, the D flip-flops 29 of all the parameter hold units 28 are reset and therefore hold default value.

Effect

The semiconductor device of the second embodiment produces not only the effect explained in item (1) explained in the first embodiment but also the effect in item (2) below.

(2) A Reset Operation can be Simplified Further.

In the second embodiment, after a circuit to be reset is reset by inputting reset command "CR," the parameter hold unit 28 is reset. Accordingly, each time a reset operation is carried out, the parameter hold unit 28 is initialized, which brings the whole of the NAND flash memory 1 into a resettable state.

Accordingly, when a reset command is input next time to reset any one of the circuits, the parameter hold unit 28 corresponding to the circuit has only to hold default value and there is no need to take into account selection information on the preceding reset operation. Therefore, the reset operation can be simplified.

Immediately after the reset operation, the predetermined target circuits are reset. That is, the target circuits are brought into the same state as when a conventional reset command was executed. Accordingly, with the configuration of the second embodiment, it is possible to allow the compatibility between a conventional reset command and the selective reset command explained in the first embodiment.

Third Embodiment

Next, a semiconductor device according to a third embodiment of the invention will be explained. The third embodiment is such that, when "0" is set in the parameter hold unit 28, a reset signal RST corresponding to the parameter hold unit 28 is output in the first and second embodiments. Hereinafter, only what differs from the first and second embodiments will be explained.

Figure 13:
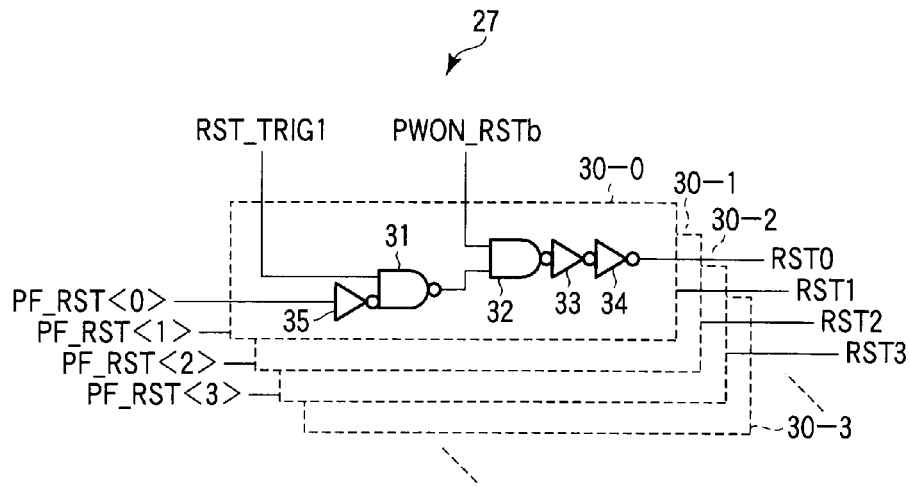
FIG. 13 is a circuit diagram of a reset control circuit according to a third embodiment of the invention.

FIG. 13 is a circuit diagram of a reset control circuit 27 according to the third embodiment. As shown in FIG. 13, each of the control units 30 further includes an inverter 35 in the configuration of FIG. 5 explained in the first embodiment. As shown in FIG. 13, the inverter 35 inverts the corresponding parameter signal PF_RST. Then, a NAND gate 31 performs NAND operation of trigger signal RST_TRIG1 and the operation result of the inverter 35. The remaining part is the same as in FIG. 5.

With the configuration of the third embodiment, when the D flip-flop 29 holds "0," that is, when parameter signal PF_RST is low, a reset signal is generated.

Fourth Embodiment

Next, a semiconductor device according to a fourth embodiment of the invention will be explained. The fourth embodiment is such that the first embodiment is applied to a test chip, such as an array diagnostic monitor (ADM) chip, which has no sequencer in the chip. Hereinafter, only what differs from the first embodiment will be explained.

Figure 14:
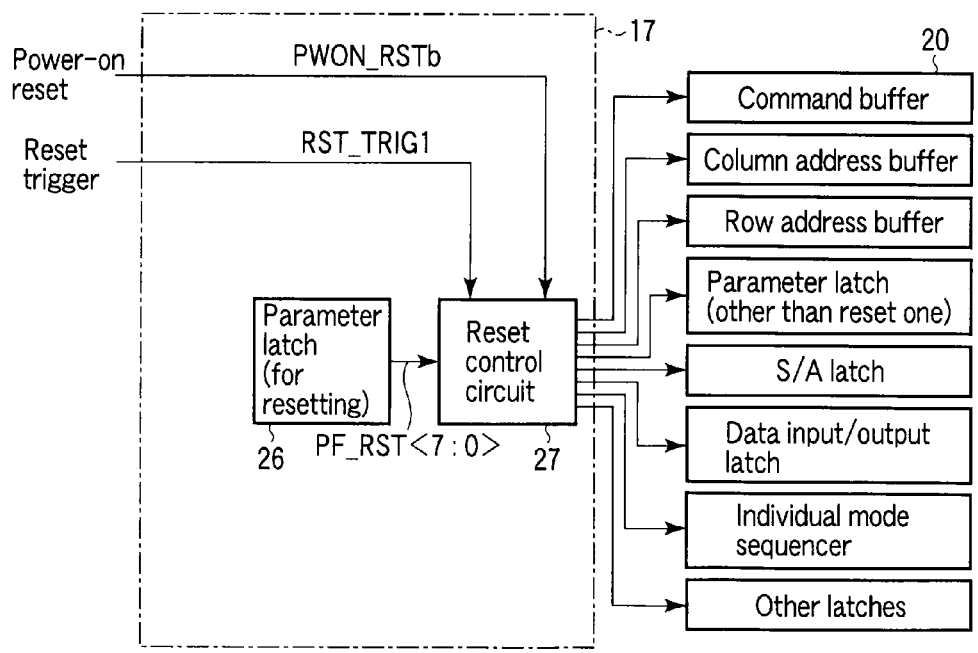
FIG. 14 is a block diagram of a control circuit according to a fourth embodiment of the invention.

FIG. 14 is a block diagram of a control circuit 17 of a NAND flash memory 1 according to the fourth embodiment, particularly showing the part necessary for a reset operation. As shown in FIG. 14, the control circuit 17 of the fourth embodiment is such that the reset sequence circuit 25 is eliminated in the configuration of FIG. 3 explained in the first embodiment. The configuration of the parameter latch 26 and reset control circuit 27 is as explained in the first embodiment. Power-on reset signal PWON_RSTb is input from outside the test chip of the NAND flash memory 1. Trigger signal RST_TRIG1 is generated by a delay circuit and others (not shown) in the test chip on the basis of a reset command externally supplied to the test chip.

Figure 15:
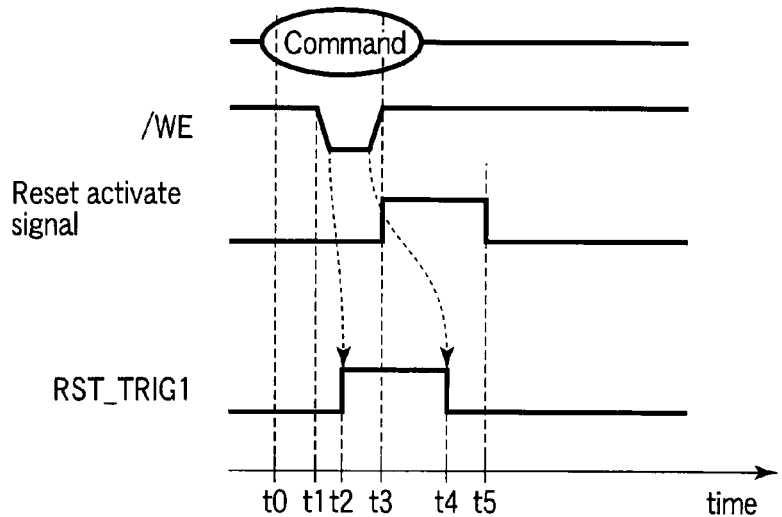
FIG. 15 is a timing chart for various signals according to the fourth embodiment.

FIG. 15 is a timing chart for a command, write enable signal /WE, a reset activate signal, and trigger signal RST_TRIG1.

As in FIG. 10, at time t0, reset command "CR" is input and, at time t1, write enable signal /WE goes low, which causes the NAND flash memory 1 to take in reset command "CR."

In addition, the delay circuit (not shown) in the NAND flash memory 1 delays write enable signal /WE, thereby generating a reset activate signal and trigger signal RST_TRIG1. As a result, in the period between times t2 and t4, trigger signal RST_TRIG1 is high. Moreover, the reset activate signal is made high in the period between times t3 and t5 later than trigger signal RST_TRIG1. Making the reset activate signal high causes the control circuit 17 to be activated. Making trigger signal RST_TRIG1 high causes a reset signal to be generated. Thereafter, at time t5, the reset activate signal goes low, which completes the reset sequence operation.

With the configuration of the fourth embodiment, even a semiconductor with no sequencer produces the effect explained in item (1) in the first embodiment.

Fifth Embodiment

Next, a semiconductor device according to a fifth embodiment of the invention will be explained. The fifth embodiment is a combination of the second and fourth embodiments. That is, the fifth embodiment is such that the reset method explained in the second embodiment is applied to a semiconductor device with no sequencer. Hereinafter, only what differs from the second and fourth embodiments will be explained.

Figure 16:
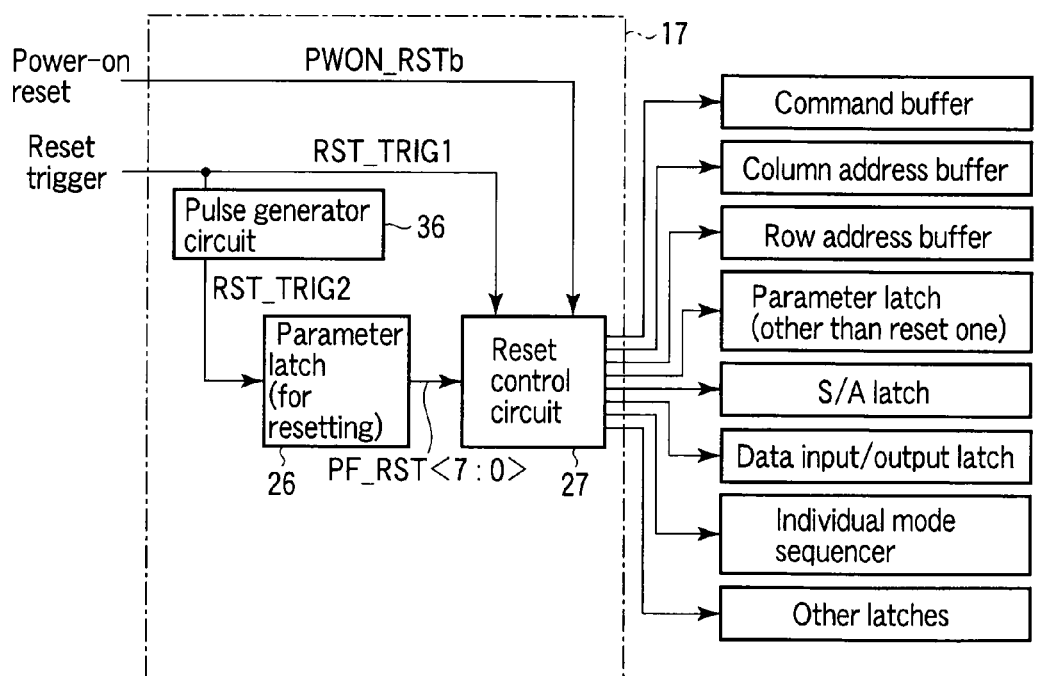
FIG. 16 is a block diagram of a control circuit according to a fifth embodiment of the invention.

FIG. 16 is a block diagram of a control circuit 17 of a NAND flash memory 1 according to the fifth embodiment, particularly showing the part necessary for a reset operation. As shown in FIG. 16, the control circuit 17 of the fifth embodiment is such that a pulse generator circuit 36 is further provided in the configuration of FIG. 14 explained in the fourth embodiment. The pulse generator circuit 36 generates trigger signal RST_TRIG2 on the basis of trigger signal RST_TRIG1 in place of the reset sequence circuit 25 of the second embodiment and supplies trigger signal RST_TRIG2 to the parameter latch 26. The remaining configuration is as explained in the second and fourth embodiments.

Figure 17:
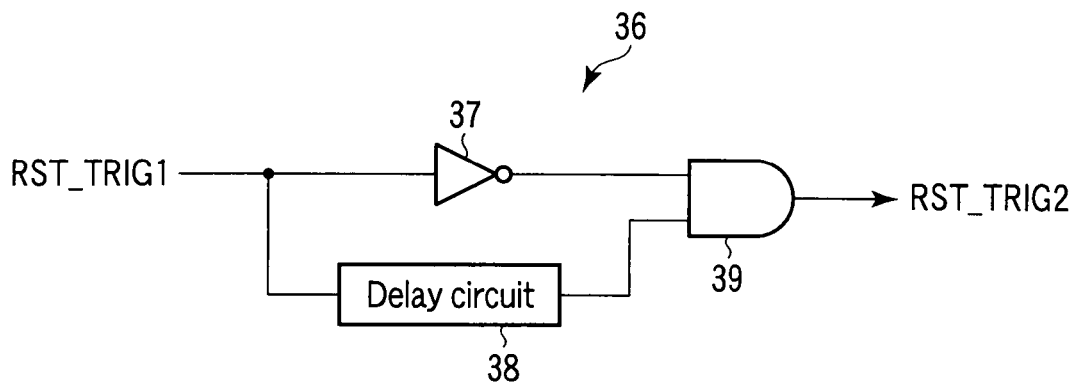
FIG. 17 is a circuit diagram of a pulse generator circuit according to the fifth embodiment.

FIG. 17 is a circuit diagram showing a configuration of the pulse generator circuit 36. As shown in FIG. 17, the pulse generator circuit 36 includes an inverter 37, a delay circuit 38, and an AND gate 39. The inverter 37 inverts trigger signal RST_TRIG1. The delay circuit 38 delays trigger signal RST_TRIG1. The AND gate 39 performs AND operation of the output signals of the inverter 37 and delay circuit 38 and outputs the result as trigger signal RST_TRIG2.

Figure 18:
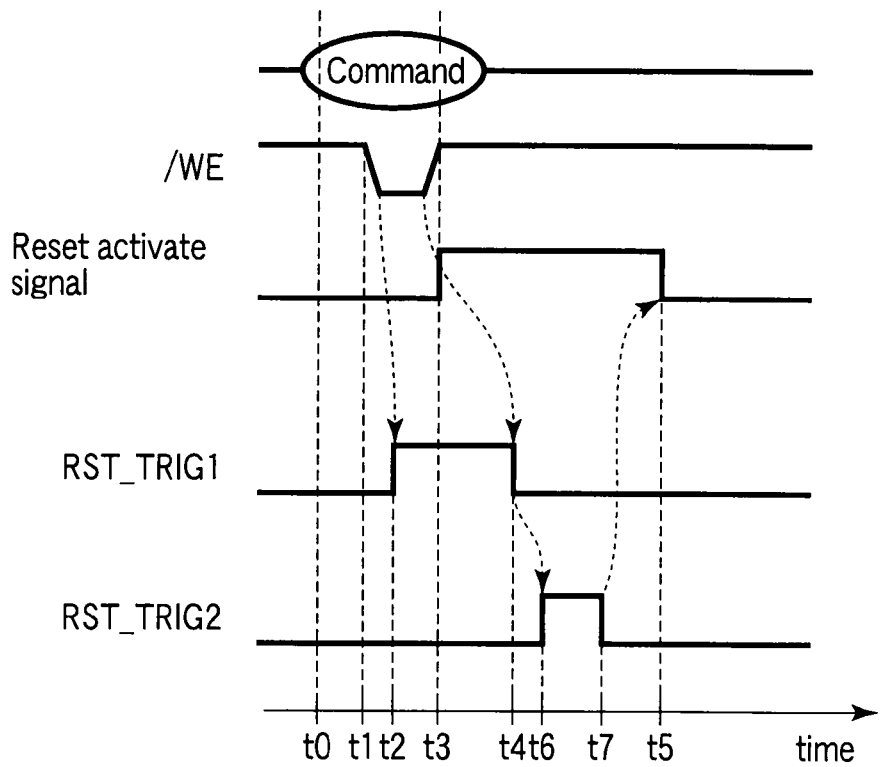
FIG. 18 is a timing chart for various signals according to the fifth embodiment.

FIG. 18 is a timing chart for a command, write enable signal /WE, a reset activate signal, and trigger signals RST_TRIG1, RST_TRIG2.

As in FIG. 15, at time t0, reset command "CR" is input and, at time t1, write enable signal /WE goes low, which causes the NAND flash memory 1 to take in reset command "CR." In the period between times t2 and t4, trigger signal RST_TRIG1 is high. In addition, the reset activate signal is made high in the period between times t3 and t5 later than trigger signal RST_TRIG1. After a reset signal RST is generated (later than time t4), the pulse generator circuit 36 makes trigger signal RST_TRIG2 high in the period between time t6 and time t7. As a result, the information in the parameter latch 26 is initialized. Then, when trigger signal RST_TRIG2 has gone low, the reset activate signal goes low.

With the configuration of the fifth embodiment, even a semiconductor with no sequencer further produces the effect explained in item (2) explained in the second embodiment.

Sixth Embodiment

Next, a semiconductor device according to a sixth embodiment of the invention will be explained. The sixth embodiment is a combination of the third embodiment and the fourth or fifth embodiment. That is, the reset control circuit 27 explained in FIG. 13 may be used in the configuration of each of the fourth and fifth embodiments.

Seventh Embodiment

Next, a semiconductor device according to a seventh embodiment of the invention will be explained. The seventh embodiment is such that the first to sixth embodiments are applied to a ReRAM (Resistance Random Access Memory). Hereinafter, only what differs from the first to sixth embodiment will be explained.

Configuration of Memory Cell Array 10

Figure 19:
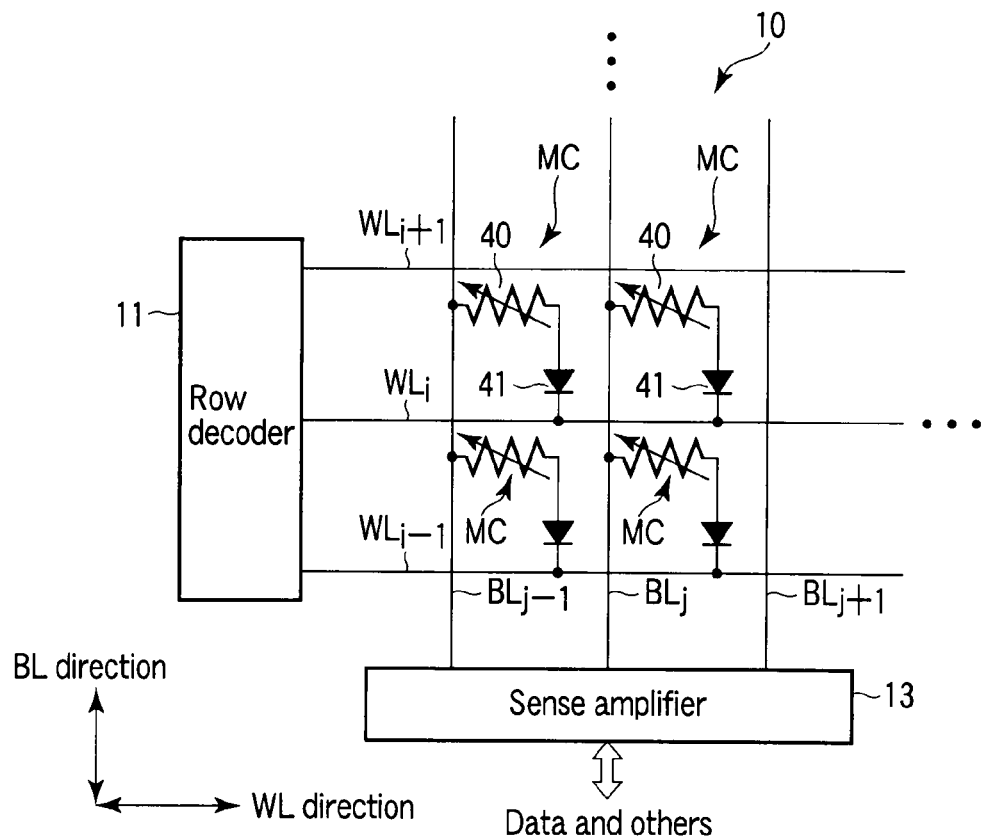
FIG. 19 is a circuit diagram of a memory cell array according to a seventh embodiment of the invention.

FIG. 19 is a circuit diagram of the memory cell array 10, particularly showing the memory cell area 22. As shown in FIG. 19, the memory cell array 10 includes a plurality of randomly-accessible memory cells MC arranged in a matrix at the intersections of a plurality of bit lines $BL_{j-1}$ to $BL_{j+1}$ and a plurality of word lines $WL_{i-1}$ to $WL_{i+1}$. Each of the memory cells MC includes a variable resistance element 40 and a diode 41. One end of the current path of the variable resistance element 40 is connected to any one of bit lines BLj−1 to BLj+1 and the other end of the current path is connected to the anode of the diode 41. The cathode of the diode 41 is connected to any one of word lines WLi−1 to WLi+1.

A plurality of units of the memory cell array 10 configured as described above are stacked one on top of another in a direction perpendicular to the surface of the semiconductor substrate.

Figure 20:
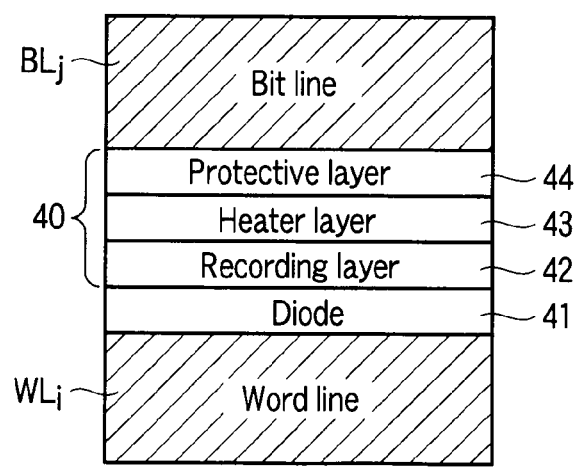
FIG. 20 is a sectional view of a memory cell according to the seventh embodiment.

FIG. 20 is a sectional view of a memory cell MC. As shown in FIG. 20, the memory cell MC has a structure where the variable resistance element 40 and diode 41 are stacked one on top of the other between a bit line bL and a word line WL. The variable resistance element 40 has a structure where a recording layer, a heater layer 43, and a protective layer 44 are stacked on the diode 41 in that order.

Figure 21:
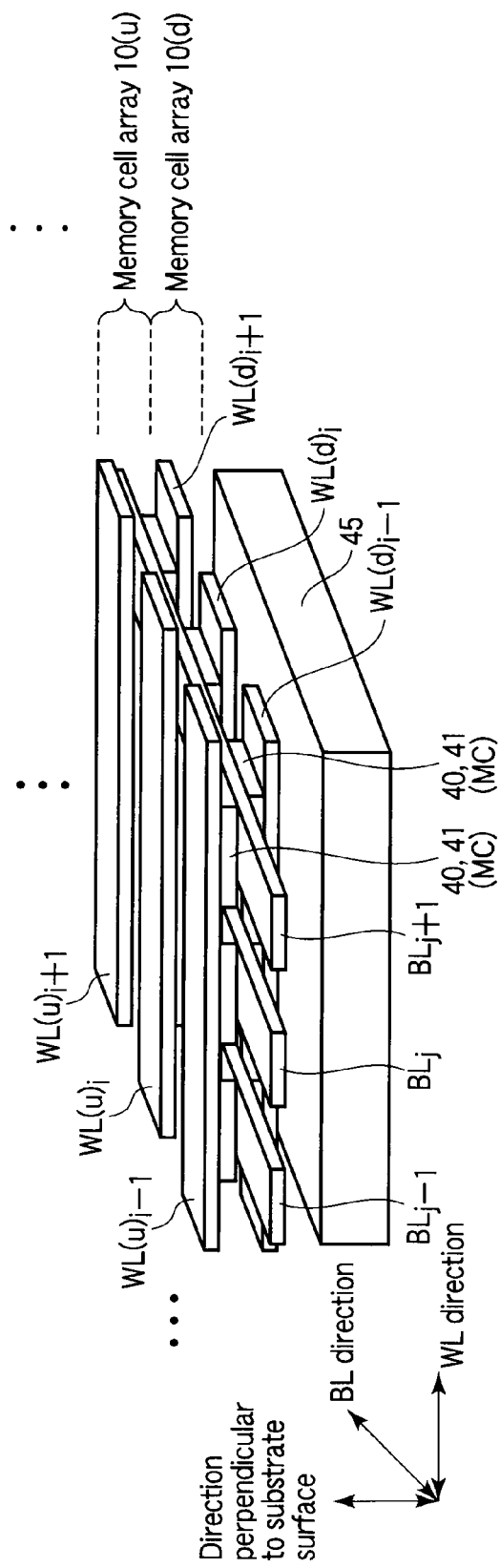
FIG. 21 is a perspective view of the memory cell array according to the seventh embodiment.

FIG. 21 is a perspective view of the memory cell array 10, showing a three-dimensional configuration of the memory cell array 10. As shown in FIG. 21, the memory cell arrays 10 of the seventh embodiment have a three-dimensional structure where a plurality of arrays (memory cell array 10(d), memory cell array 10(u), . . . ) are stacked one on top of another in a direction perpendicular to the surface of the semiconductor substrate 45.

As shown in FIG. 21, a first-layer memory cell array 10(d) is provided at the intersections of word lines (WLi−1(d), WLi(d), WLi+1(d)) and bit lines (BLj−1, BLj, BLj+1) in a direction perpendicular to the surface of the semiconductor substrate 45. A second-layer memory cell array 10(u) is provided at the intersections of word lines (WLi−1(u), WLi(u), WLi+1(u)) and bit lines (BLj−1, BLj, BLj+1).

As described above, the memory cell array 10 of the seventh embodiment has a three-dimensional structure where a plurality of arrays (memory cell array 10(d), memory cell array 10(u), . . . ) are stacked one on top of another in a direction perpendicular to the surface of the semiconductor substrate 45. Accordingly, the memory cell array 10 of the seventh embodiment has the advantage of having a larger capacity than a two-dimensional-structure memory cell array where only one layer is provided on a semiconductor substrate.

Similarly, the three-dimensional structure may have more than two layers (e.g., three or four layers) of memory cell array 10 stacked one on top of another. Although not shown in FIG. 21, there is provided a select transistor which selects any one of the memory cell arrays (memory cell array 10(d), memory cell array 10(u), . . . ) stacked on the semiconductor substrate 45.

Data Write, Read, and Erase Operations

Next, the operation of writing and reading data in the ReRAM configured as described above will be explained briefly.

First, a data write operation will be described. When data is written, a voltage is applied to the variable resistance element 40 of the selected memory cell MC to generate a potential gradient in the variable resistance element 40, thereby applying a current pulse. For example, the potential on word line WLi is made relatively lower than the potential on bit line BLj. If bit line BLj is at a fixed potential (e.g., the ground potential), a negative potential is applied to word line WLi.

In the data write operation, the program voltage Vpgm is supplied to the selected bit line BLj, and the unselected bit lines BLj−1, BLj+1 are grounded. The selected word line WLi is grounded, and the voltage VUX is supplied to the unselected word lines WLi−1, WLi+1. The voltage VUX is the same voltage as, for example, the program voltage Vpgm.

The sum of the potential at the selected word line and VF is higher than the potential at the unselected word line to avoid the unselected memory cell to erroneously selected, where the VF indicates the voltage drop in pn-junction of the diode 41.

Next, a read operation will be explained. Data is read by applying a voltage pulse to the selected variable resistance element 40 and detecting the resistance value of the memory cell MC. The amplitude of the voltage pulse is preferably as small as the material constituting the variable resistance element 40 does not change its state.

For example, a read current generated by the voltage generator circuit 18 is caused to flow from bit line BLj to the selected memory cell MC. The sense amplifier 13 measures its resistance value, thereby reading data.

A data erase operation is carried out by applying a large-current pulse to the selected variable resistance element 40 for Joule heating to accelerate an oxidation-reduction reaction in the variable resistance element 40.

Command Sequence of ReRAM

Figure 22:
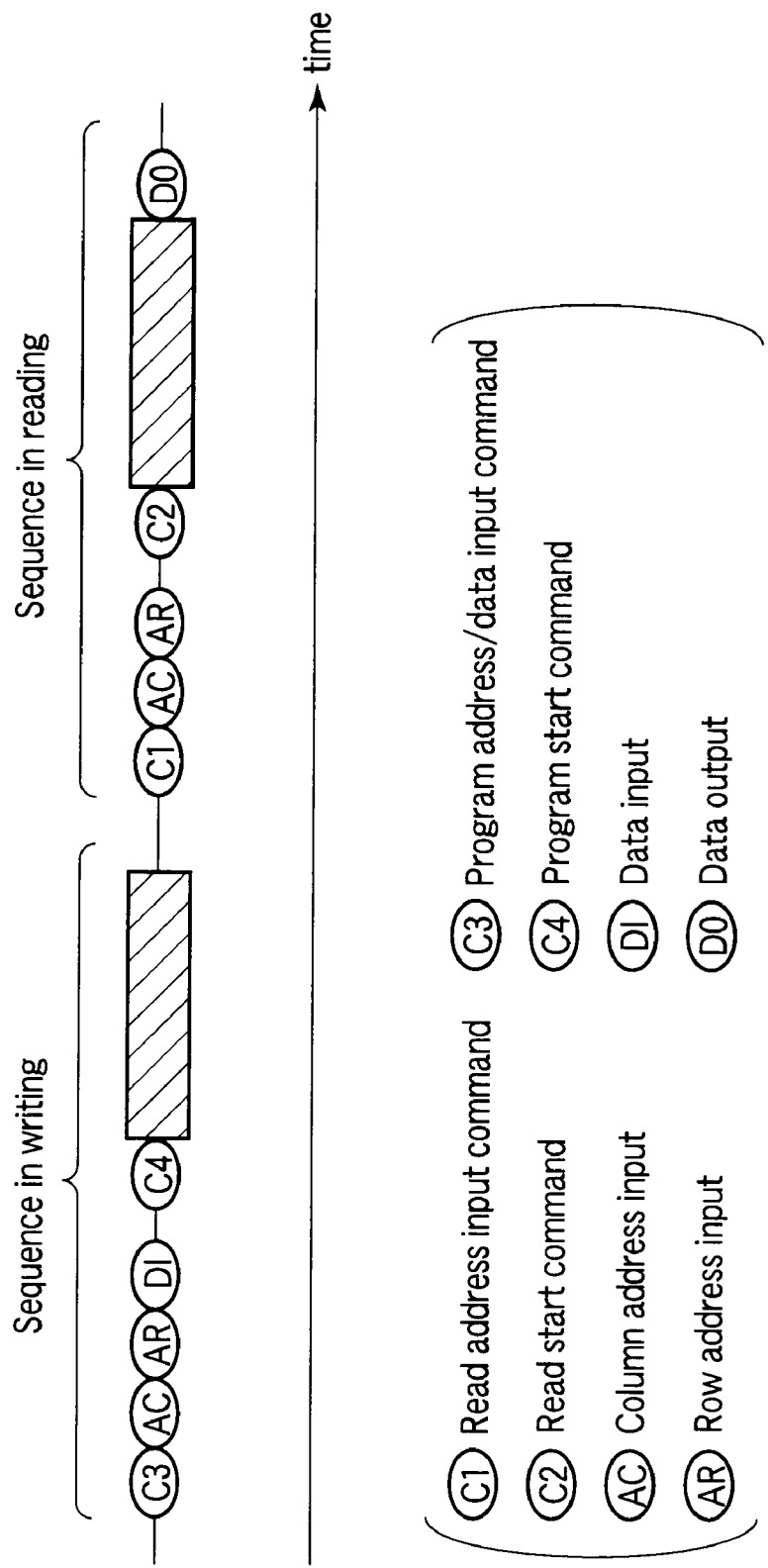
FIG. 22 is a timing chart to explain command sequences according to the seventh embodiment.

Next, a command sequence in operating the ReRAM will be explained, taking a read operation and a write operation as an example. FIG. 22 is a timing chart to explain a command sequence in reading and writing data. The ReRAM of the seventh embodiment executes a command sequence corresponding to a NAND interface complying with the NAND flash memory. In FIG. 22, "C1" indicates an address input command in a read operation; "C2", a read start command; "AC", a column address input; "AR", a row address input; "C3", an address and a data input command in a write operation; "C4", a program start command; "DI", data input; and "DO", data output. Each of the shaded portions indicates a period when a sequencer operates. During the period, the ReRAM is in the busy state.

First, a sequence in writing data will be explained. When programming is performed, an address and data input command "C3" are input and then column address "AC," row address "AR," and write data "DI" are input. Thereafter, when program start command "C4" is input, a write sequencer is activated, executing a sequence for writing data.

Next, a sequence in reading data will be explained. First, address input command "C1" in a read operation is input and then column address "AC" and row address "AR" are input. Thereafter, when read start command "C2" is input, a read sequencer is activated, executing a sequence for reading data. Then, data DO read according to the sequence is output to the outside.

In the above sequence, when reset command "CR" is input during the execution of the sequence as in CASE 1 explained with reference to FIG. 8 in the first embodiment, the sequencer interrupts the operation and executes a reset sequence. In test operations, various parameters and operation modes can be set as in CASE 2 in FIG. 8. In a reset operation activated by reset command "CR," reset signal RST is generated according to the information held in the parameter latch 26.

As described above, the configuration of each of the first to sixth embodiments can be applied to not only a NAND flash memory but also a ReRAM.

As described above, a semiconductor device according to each of the first to seventh embodiments comprises a reset control unit 27 which outputs a reset signal RST to each of the circuits capable of being reset, in response to a power-on reset signal PWON_RSTb and a first trigger signal RST_TRIG1 and a latch circuit 26 which is capable of holding selection information on the circuits. The selection information is externally input to the latch circuit. The reset control circuit 27 selectively controls the first trigger signal RST_TRIG1 on a circuit basis according to selection information held in the latch circuit 26. More specifically, according to the selection information, the reset control circuit 27 outputs a reset signal RST to any one of the circuits which is a reset target in the selection information and does not output a reset signal RST to the circuits which is not reset target in the selection information.

Accordingly, it is possible to reset only the necessary circuits in response to an externally supplied reset command and not to reset a circuit in which the user wants to leave the data. Accordingly, test operations or the like can be simplified.

While in the above embodiments, the explanation has been given, taking a NAND flash memory and a ReRAM as examples of a semiconductor device, the embodiments may be applied to other semiconductor memories, such as other types of flash memory, including a NOR flash memory, a ferroelectric memory, or a DRAM. Moreover, the embodiments may be applied not only to semiconductor memories but also to semiconductor integrated circuits in general. While in the above embodiments, the commands provided for the NAND interface have been used as an example of reset commands, the embodiments are not limited to this. For instance, other commands may be used, provided that they are supplied externally and are signals which instruct a semiconductor device to carry out a reset operation or which are supplied externally when a reset operation is started.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a reset sequence circuit which is activated by receiving an externally input signal when a reset operation is started and outputs a first trigger signal;
   a latch circuit which is capable of holding selection information on circuits capable of being reset, the selection information being externally input; and
   a reset control circuit which outputs a reset signal on the basis of the selection information held in the latch circuit in response to a power-on reset signal and the first trigger signal output from the reset sequence circuit.

2. The device according to claim 1, wherein the reset control circuit selectively controls the first trigger signal for each of the circuits according to the selection information held in the latch circuit.

3. The device according to claim 1, wherein the reset control circuit outputs the reset signal to any one of the circuits which is a reset target in the selection information and does not output the reset signal to any one of the circuits which is not the reset target in the selection information.

4. The device according to claim 1, wherein the latch circuit is reset by a second trigger signal output from the reset sequence circuit, and
   the second trigger signal is generated later than the first trigger signal.

5. The device according to claim 4, wherein the latch circuit includes a plurality of hold units which are associated with the circuits, respectively,
   each of the hold units holds information as to whether the associated one of the circuits is a reset target or not, and
   all of the hold units hold information which indicates that the associated one of the circuits is the reset target, by being reset by the second trigger signal.

6. The device according to claim 1, wherein the reset control circuit, when the power-on reset signal is asserted, outputs the reset signal, regardless of the selection information, and
   when the first trigger signal is asserted, outputs the reset signal according to the selection information.

7. The device according to claim 1, further comprising a semiconductor memory capable of holding data,
   wherein the latch circuit includes a plurality of hold units which are associated with the circuits, respectively,
   each of the hold units holds information as to whether the associated one of the circuits is a reset target or not, and
   the circuits include at least any of a command buffer, an address buffer, a parameter latch, a sense amplifier latch, a data input/output latch, and an individual mode sequencer in the semiconductor memory.

8. The device according to claim 7, wherein the semiconductor memory is a NAND flash memory.

9. The device according to claim 7, wherein the semiconductor memory is a ReRAM (Resistance Random Access Memory).

10. A semiconductor device comprising:
    a latch circuit which is capable of holding selection information on circuits capable of being reset, the selection information being externally input; and
    a reset control circuit which outputs a reset signal on the basis of the selection information held in the latch circuit in response to an externally supplied power-on reset signal and a first trigger signal generated according to a signal externally input when a reset operation is started.

11. The device according to claim 10, wherein the reset control circuit selectively controls the first trigger signal for each of the circuits according to the selection information held in the latch circuit.

12. The device according to claim 10, wherein the reset control circuit outputs the reset signal to any one of the circuits which is a reset target in the selection information and does not output the reset signal to any one of the circuits which is not the reset target in the selection information.

13. The device according to claim 10, further comprising a generator circuit which generates a second trigger signal on the basis of the first trigger signal,
    wherein the latch circuit is initialized by the second trigger signals, and
    the second trigger signal is generated later than the first trigger signal.

14. The device according to claim 13, wherein the latch circuit includes a plurality of hold units which are associated with the circuits, respectively,
    each of the hold units holds information as to whether the associated one of the circuits is a reset target or not, and all of the hold units hold information which indicates that the associated one of the circuits is the reset target, by the second trigger signal.

15. The device according to claim 10, wherein the reset control circuit, when the power-on reset signal is asserted, outputs the reset signal, regardless of the selection information, and when the first trigger signal is asserted, outputs the reset signal according to the selection information.

16. The device according to claim 10, further comprising a semiconductor memory capable of holding data, wherein the latch circuit includes a plurality of hold units which are associated with the circuits, respectively, each of the hold units holds information as to whether the associated one of the circuits is a reset target or not, and the circuits include at least any of a command buffer, an address buffer, a parameter latch, a sense amplifier latch, a data input/output latch, and an individual mode sequencer in the semiconductor memory.

17. The device according to claim 16, wherein the semiconductor memory is a NAND flash memory.

18. The device according to claim 16, wherein the semiconductor memory is a ReRAM (Resistance Random Access Memory).

* * * * *